United States Patent
Mohamed Salleh et al.

(10) Patent No.: US 12,434,275 B2
(45) Date of Patent: Oct. 7, 2025

(54) METHOD AND DEVICE FOR CLEANING SURFACE OF COMPONENT

(71) Applicant: ROLLS-ROYCE plc, London (GB)

(72) Inventors: Najib Bin Mohamed Salleh, Singapore (SG); Sherilyn Lim, Singapore (SG)

(73) Assignee: ROLLS-ROYCE plc, London (GB)

( * ) Notice: Subject to any disclaimer, the term of this patent is extended or adjusted under 35 U.S.C. 154(b) by 84 days.

(21) Appl. No.: 18/386,104

(22) Filed: Nov. 1, 2023

(65) Prior Publication Data

US 2024/0165679 A1    May 23, 2024

(30) Foreign Application Priority Data

Nov. 17, 2022   (GB) ...................................... 2217183

(51) Int. Cl.
| | |
|---|---|
| *B08B 7/00* | (2006.01) |
| *B08B 1/16* | (2024.01) |
| *B08B 5/04* | (2006.01) |
| *C11D 3/04* | (2006.01) |
| *C11D 3/37* | (2006.01) |

(52) U.S. Cl.
CPC ............ *B08B 7/0014* (2013.01); *B08B 1/165* (2024.01); *B08B 5/04* (2013.01); *C11D 3/04* (2013.01); *C11D 3/3753* (2013.01); *C11D 2111/20* (2024.01)

(58) Field of Classification Search
CPC .. B08B 7/00; B08B 1/165; B08B 5/04; C11D 3/04; C11D 3/3753; C11D 2111/20
See application file for complete search history.

(56) References Cited

U.S. PATENT DOCUMENTS

| | | | |
|---|---|---|---|
| 5,938,402 A | 8/1999 | Bochud et al. | |
| 6,776,171 B2* | 8/2004 | Carpenter | B08B 7/0014 134/4 |
| 2013/0048031 A1* | 2/2013 | Minkin | A61B 1/00135 134/198 |
| 2015/0014362 A1* | 1/2015 | Ikushima | B05C 5/0225 222/504 |

(Continued)

FOREIGN PATENT DOCUMENTS

| | | |
|---|---|---|
| CN | 201441998 U | 4/2010 |
| CN | 216026447 U | 3/2022 |
| WO | 2013/017854 A1 | 2/2013 |

OTHER PUBLICATIONS

May 18, 2023 Search Report issued in British Patent Application No. 2217183.9.

(Continued)

*Primary Examiner* — Sharidan Carrillo
(74) *Attorney, Agent, or Firm* — Oliff PLC (57) ABSTRACT

A method for cleaning a surface of a component includes placing a volume of a cleaning agent onto the surface of the component. The method further includes performing a repair operation of the component either before or after placing the volume of the cleaning agent. The repair operation results in a generation of contaminant particles. Upon contact of the cleaning agent with the contaminant particles, the cleaning agent absorbs the contaminant particles by adhesion. The method further includes removing the cleaning agent from the surface of the component after the contaminant particles are absorbed by the cleaning agent.

7 Claims, 9 Drawing Sheets

(56) References Cited

U.S. PATENT DOCUMENTS

| | | | |
|---|---|---|---|
| 2015/0128994 A1* | 5/2015 | Kaneko | H01L 21/67051 |
| | | | 134/4 |
| 2018/0258787 A1 | 9/2018 | Tibbetts et al. | |
| 2021/0237128 A1* | 8/2021 | Yoshida | H01L 21/02057 |
| 2024/0110084 A1* | 4/2024 | Lagudu | C09J 133/10 |

OTHER PUBLICATIONS

Gutierrez G., Sandra. "This DIY slime can clean the grossest parts of your home and car". Available from https://www.popsci.com/diy/diy-cleaning-slime/, Jun. 2021, pp. 1-4.

* cited by examiner

METHOD AND DEVICE FOR CLEANING SURFACE OF COMPONENT

This specification is based upon and claims the benefit of priority from UK Patent Application Number 2217183.9 filed on Nov. 17, 2022, the entire contents of which are incorporated herein by reference.

BACKGROUND

Field of the Disclosure

The present disclosure relates to cleaning of a component, and in particular, to a method and a device for cleaning a surface of the component.

Background of the Disclosure

A gas turbine engine generally includes components such as, for example, shroud assemblies, compressor rotor blades, and turbine rotor blades. Such engine components may need repair in case of any damages to ensure efficient operation of the gas turbine engine. Typically, a repair operation, such as, polishing or borescope blending, may be performed on the engine components to repair damages in the engine components.

The repair operation may generate contaminants, such as, debris that may accumulate on the engine components. In an example, the contaminants accumulated on the engine component may impact an aerodynamic efficiency with resultant deterioration in engine performance. Thus, the engine components may need to be cleaned so that the contaminants do not interfere with the operation of the gas turbine engine. Conventionally, a detergent may be used for cleaning the engine components. However, detergents may not be able to efficiently reach and remove contaminants from compact areas of the engine components. In some examples, an increased detergent flow at a higher pressure may be needed for cleaning the engine components. Further, the detergent may include acidic substances that may react with metallic engine components. Such a reaction may cause damage to the engine components and may also create complications in the operation of the gas turbine engine, which is not desirable. Moreover, additional care may have to be taken when cleaning a critical engine component. For example, scrapping dirt from a surface of an engine component may in turn damage the surface. Moreover, use of compressed air may force contaminants, such as dirt, into less accessible areas of the gas turbine engine, and it may be cumbersome to remove the contaminants from such areas.

In some cases, a nozzle coupled with a borescope tube may be used to remove the contaminants from the engine components by creating a negative pressure. However, the nozzle may be restricted to removal of oil from engine components. In some examples, loose debris may be removed via an air blast kit or a vacuum kit. However, usage of conventional cleaning tools mentioned above may not be efficient and reliable in cleaning a module/whole engine due to a size, weight, and power requirement of such cleaning tools.

SUMMARY OF THE DISCLOSURE

According to a first aspect, there is provided a method for cleaning a surface of a component. The method includes placing a volume of a cleaning agent onto the surface of the component. The method further includes performing a repair operation of the component either before or after placing the volume of the cleaning agent. The repair operation results in a generation of contaminant particles. Upon contact of the cleaning agent with the contaminant particles, the cleaning agent absorbs the contaminant particles by adhesion. The method further includes removing the cleaning agent from the surface of the component after the contaminant particles are absorbed by the cleaning agent.

The component may be a part of a machine, such as a gas turbine engine. The method of the present disclosure may provide a retrofittable, robust, and an in-situ technique for cleaning of various components, which may improve an uptime of an asset, such as, the gas turbine engine. More particularly, the gas turbine engine may not need to be disassembled to clean the component, thereby reducing time required for maintenance activities. The method described herein may be used to clean various components of the gas turbine engine. Further, the method described herein may allow easy and efficient removal of contaminant particles, such as, dust and debris, from a number of surfaces of the component.

Further, using the cleaning agent for cleaning the surface may be more effective as compared to conventional cleaning processes. The cleaning agent may easily reach constrained or compact areas of the gas turbine engine and may allow removal of the contaminant particles from a target area to be cleaned. Moreover, the method ensures a direct contact of the cleaning agent with the contaminant particles, which may prevent any further dispersion of the contaminant particles. In some cases, the cleaning agent may also be reused for removal of contaminant particles from a different component. The cleaning agent may be applied prior to or after the repair of the component. For example, the cleaning agent may be used to clean the component before the repair operation, thereby presenting a clean surface for performing the repair operation. In such examples, the contaminant particles may not merge with the component when an operation, such as, welding or bonding is being performed on the component. Further, the cleaning agent may also absorb the contaminant particles generated during the repair operation and can be easily removed after the repair operation. In another example, the cleaning agent may be used to clean the component after the repair operation to remove any contaminant particles that may be generated during the repair operation. Further, after the contaminant particles adhere to the cleaning agent, the cleaning agent and the contaminant particles may be easily removed together by an extraction process.

In some embodiments, placing the volume of the cleaning agent onto the surface of the component further includes injecting, via a delivery tube, the volume of the cleaning agent onto the surface of the component. Using the delivery tube, a desired volume of the cleaning agent may be easily injected onto the surface of the component.

In some embodiments, the method further includes removably attaching the delivery tube with a guide tube. In some embodiments, the method further includes guiding, via the guide tube, the delivery tube to a location near the surface of the component for injecting the volume of the cleaning agent onto the surface of the component. The guide tube may allow the delivery tube to be accurately positioned at the target area for injecting the volume of the cleaning agent onto the surface of the component.

In some embodiments, the method further includes dispensing, via a syringe, the cleaning agent into the delivery tube. In other words, the syringe may be used for dispensing the cleaning agent at compact or hard to reach areas of the component. The volume of the cleaning agent being dispensed into the delivery tube may be controlled by the syringe, based on factors, such as, a size of the target area or an amount of the contaminant particles.

In some embodiments, removing the cleaning agent from the surface of the component further includes aspirating, via the syringe, the cleaning agent from the surface through the delivery tube after the contaminant particles are absorbed to the cleaning agent. Thus, the single syringe may be used for dispensing the cleaning agent into the delivery tube as well as aspirating the cleaning agent from the surface of the component through the delivery tube.

In some embodiments, the cleaning agent includes a mixture of at least water, borax, and polyvinyl alcohol. The cleaning agent including a combination of water, borax, and polyvinyl alcohol may exhibit adhesion properties that may allow adhesion of the contaminant particles with the cleaning agent. Further, the cleaning agent may not include any acidic substances that may corrode metallic materials of the component. Moreover, absence of any acidic substance may eliminate a requirement of a masking agent.

In some embodiments, the method further includes mixing water and borax in a weight ratio of 1:16 to obtain an activator solution. In some embodiments, the method further includes mixing polyvinyl alcohol and water in a weight ratio of 1:1 to obtain a glue solution. In some embodiments, the method further includes mixing the activator solution and the glue solution in a weight ratio of 1:1 to obtain the cleaning agent. In other words, the composition of the cleaning agent may provide adhesion characteristics and viscosity that may allow adhesion of the contaminant particles therewith. Further, in other examples, the weight ratios of the water, borax, and polyvinyl alcohol may be modified to obtain a cleaning agent having different adhesion characteristics and viscosity.

In some embodiments, the method further includes contacting an abrasive mesh with the surface of the component for loosening the contaminant particles from the surface of the component before placing the volume of the cleaning agent. The abrasive mesh may facilitate an easy removal of any contaminant particles that may be stuck to the surface of the component.

In some embodiments, performing the repair operation of the component includes performing the repair operation after placing the volume of the cleaning agent. Further, injecting the volume of the cleaning agent before the repair operation may present a clean surface for performing the repair operation. In such examples, the contaminant particles may not merge with the component when an operation, such as, welding or bonding is being performed on the component. Moreover, performing the repair operation after placing the volume of the cleaning agent may also facilitate containment of the contaminant particles by preventing further dispersion of the contaminant particles.

In some embodiments, performing the repair operation of the component includes performing the repair operation before placing the volume of the cleaning agent. In such examples, the cleaning agent may be used to clean the component after the repair operation to remove any contaminant particles that may be generated during the repair operation.

According to a second aspect, there is provided a device for cleaning a surface of a component. The device includes a delivery tube configured to inject a volume of a cleaning agent onto the surface of the component. The surface of the component includes contaminant particles generated as a result of a repair operation performed on the component. Upon contact of the cleaning agent with the contaminant particles, the cleaning agent absorbs the contaminant particles by adhesion. The device further includes a syringe fluidly coupled to the delivery tube and configured to dispense the cleaning agent into the delivery tube. Upon dispensing the cleaning agent into the delivery tube, the delivery tube injects the volume of the cleaning agent onto the surface. The syringe is further configured to aspirate the cleaning agent through the delivery tube in order to remove the cleaning agent from the surface after the contaminant particles are absorbed by the cleaning agent. The device further includes a guide tube removably attached to the delivery tube and configured to guide the delivery tube to a location near the surface of the component for injecting the volume of the cleaning agent onto the surface of the component.

The device may provide a retrofittable, robust, and an in-situ solution for cleaning of various components, which may improve an uptime of an asset, such as, a gas turbine engine. More particularly, the gas turbine engine may not have to be disassembled to clean the component, thereby reducing time required for maintenance activities. The device described herein may be used with the method of the first aspect to efficiently clean the surface of the component. The device described herein may be used to clean various components of the gas turbine engine. Further, the device may allow easy and efficient removal of the contaminant particles, such as, dust and debris, from a number of surfaces of the component.

Further, using the cleaning agent for cleaning the surface may be more effective as compared to conventional cleaning processes. The cleaning agent may easily reach constrained or compact areas of the gas turbine engine and may allow removal of the contaminant particles from the target area to be cleaned. Moreover, the device ensures that there is a direct contact of the cleaning agent with the contaminant particles, which may prevent any further dispersion of the contaminant particles. In some cases, the cleaning agent may also be reused for removal of the contaminant particles from a different component.

Further, the cleaning agent may be applied prior to or after the repair of the component. For example, the cleaning agent may be used to clean the component before the repair operation, thereby presenting a clean surface for performing the repair operation. In such examples, the contaminant particles may not merge with the component when an operation, such as, welding or bonding is being performed on the component. Further, the cleaning agent may also absorb the contaminant particles generated during the repair operation and can be easily removed after the repair operation. In other examples, the cleaning agent may be used to clean the component after the repair operation to remove any contaminant particles that may be generated during the repair operation. Further, when the cleaning agent absorbs the contaminant particles, the cleaning agent and the contaminant particles may be easily removed together by an extraction process.

The guide tube may allow the delivery tube to be accurately positioned at the target area for injecting the volume of the cleaning agent onto the surface of the component. Further, the syringe of the device may be used for dispensing the cleaning agent at compact or hard to reach areas of the component. The volume of the cleaning agent being dispensed into the delivery tube may be controlled by the syringe, based on factors, such as, a size of the target area or an amount of the contaminant particles. Further, the syringe may be used for dispensing the cleaning agent into the delivery tube as well as aspirating the cleaning agent from the surface of the component through the delivery tube. The device may be at least partially received within a bore defined by the gas turbine engine, such that the delivery tube may allow dispensing of the cleaning agent on the surface of the component.

In some embodiments, the device further includes a fastening means to removably attach the delivery tube to the guide tube. The fastening means may securely couple the delivery tube with the guide tube so that the delivery tube may be guided to a location near the surface of the component for injecting the volume of the cleaning agent onto the surface of the component.

In some embodiments, the device further includes an abrasive mesh attached to the delivery tube and configured to contact with the surface of the component for loosening the contaminant particles from the surface of the component. The abrasive mesh may be configured to contact with the surface of the component before the delivery tube injects the volume of the cleaning agent onto the surface of the component. Loosening the contaminant particles from the surface of the component may facilitate an easy removal of any contaminant particles that may be stuck to the surface of the component.

In some embodiments, the device further includes a loop connected to the delivery tube and extending from an end of the delivery tube. The loop is configured to removably hold the abrasive mesh. The loop may securely hold the abrasive mesh while the abrasive mesh contacts with the surface of the component for loosening the contaminant particles from the surface of the component.

As noted elsewhere herein, the present disclosure may relate to a gas turbine engine. Such a gas turbine engine may comprise an engine core comprising a turbine, a combustor, a compressor, and a core shaft connecting the turbine to the compressor. Such a gas turbine engine may comprise a fan (having fan blades) located upstream of the engine core.

Arrangements of the present disclosure may be particularly, although not exclusively, beneficial for fans that are driven via a gearbox. Accordingly, the gas turbine engine may comprise a gearbox that receives an input from the core shaft and outputs drive to the fan so as to drive the fan at a lower rotational speed than the core shaft. The input to the gearbox may be directly from the core shaft, or indirectly from the core shaft, for example via a spur shaft and/or gear. The core shaft may rigidly connect the turbine and the compressor, such that the turbine and compressor rotate at the same speed (with the fan rotating at a lower speed). The gearbox may be a reduction gearbox (in that the output to the fan is a lower rotational rate than the input from the core shaft). Any type of gearbox may be used.

The gas turbine engine as described and/or claimed herein may have any suitable general architecture. For example, the gas turbine engine may have any desired number of shafts that connect turbines and compressors, for example one, two or three shafts. Purely by way of example, the turbine connected to the core shaft may be a first turbine, the compressor connected to the core shaft may be a first compressor, and the core shaft may be a first core shaft. The engine core may further comprise a second turbine, a second compressor, and a second core shaft connecting the second turbine to the second compressor. The second turbine, second compressor, and second core shaft may be arranged to rotate at a higher rotational speed than the first core shaft.

In such an arrangement, the second compressor may be positioned axially downstream of the first compressor. The second compressor may be arranged to receive (for example directly receive, for example via a generally annular duct) flow from the first compressor.

In any gas turbine engine as described and/or claimed herein, a combustor may be provided axially downstream of the fan and compressor(s). For example, the combustor may be directly downstream of (for example at the exit of) the second compressor, where a second compressor is provided. By way of further example, the flow at the exit to the combustor may be provided to the inlet of the second turbine, where a second turbine is provided. The combustor may be provided upstream of the turbine(s).

The or each compressor (for example the first compressor and 9ypassd compressor as described above) may comprise any number of stages, for example multiple stages. Each stage may comprise a row of rotor blades and a row of stator vanes, which may be variable stator vanes (in that their angle of incidence may be variable). The row of rotor blades and the row of stator vanes may be axially offset from each other.

The or each turbine (for example the first turbine and second turbine as described above) may comprise any number of stages, for example multiple stages. Each stage may comprise a row of rotor blades and a row of stator vanes. The row of rotor blades and the row of stator vanes may be axially offset from each other.

Gas turbine engines in accordance with the present disclosure may have any desired bypass ratio, where the bypass ratio is defined as the ratio of the mass flow rate of the flow through the bypass duct to the mass flow rate of the flow through the core at cruise conditions. The bypass duct may be substantially annular. The bypass duct may be radially outside the engine core. The radially outer surface of the bypass duct may be defined by a nacelle and/or a fan case.

Specific thrust of an engine may be defined as the net thrust of the engine divided by the total mass flow through the engine. At cruise conditions, the specific thrust of an engine described and/or claimed herein may be less than (or on the order of) any of the following: 110 Nkg-1s, 105 Nkg-1s, 100 Nkg-1s, 95 Nkg-1s, 90 Nkg-1s, 85 Nkg-1s or 80 Nkg-1s. The specific thrust may be in an inclusive range bounded by any two of the values in the previous sentence (i.e., the values may form upper or lower bounds), for example in the range of from 80 Nkg-1s to 100 Nkg-1s, or 85 Nkg-1s to 95 Nkg-1s. Such engines may be particularly efficient in comparison with conventional gas turbine engines.

A fan blade and/or aerofoil portion of a fan blade described and/or claimed herein may be manufactured from any suitable material or combination of materials. For example, at least a part of the fan blade and/or aerofoil may be manufactured at least in part from a composite, for example a metal matrix composite and/or an organic matrix composite, such as carbon fibre.

The fan of a gas turbine as described and/or claimed herein may have any desired number of fan blades, for example 14, 16, 18, 20, 22, 24 or 26 fan blades.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which.

DETAILED DESCRIPTION OF THE DISCLOSURE

Aspects and embodiments of the present disclosure will now be discussed with reference to the accompanying figures. Further aspects and embodiments will be apparent to those skilled in the art.

Figure 1:
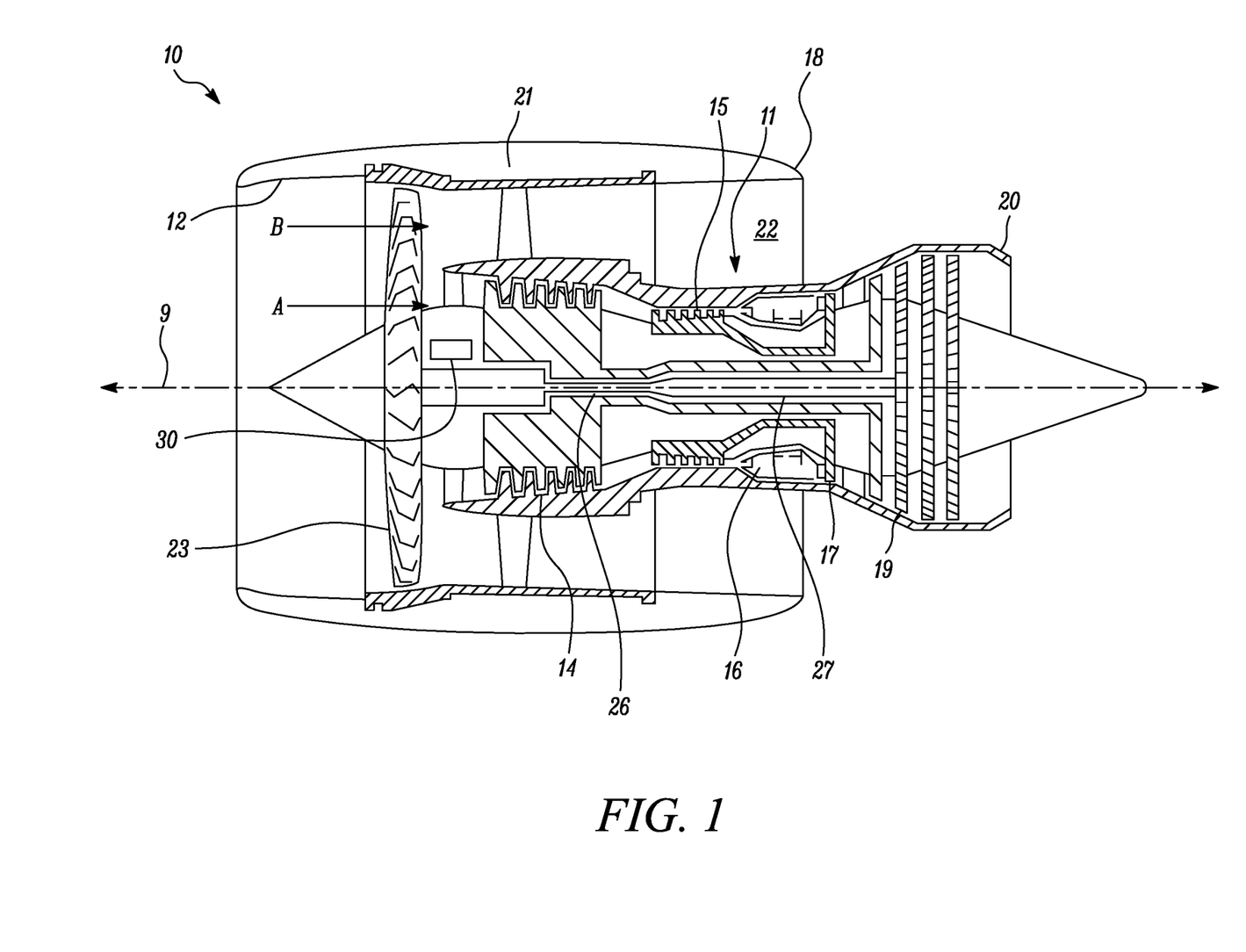
FIG. 1 is a sectional side view of a gas turbine engine, according to an embodiment of the present disclosure.

FIG. 1 illustrates a gas turbine engine 10 having a principal rotational axis 9. The engine 10 comprises an air intake 12 and a propulsive fan 23 that generates two airflows: a core airflow A and a bypass airflow B. The gas turbine engine 10 comprises a core 11 that receives the core airflow A. The engine core 11 comprises, in axial flow series, a low pressure compressor 14, a high pressure compressor 15, combustion equipment 16, a high pressure turbine 17, a low pressure turbine 19 and a core exhaust nozzle 20. A nacelle 21 surrounds the gas turbine engine 10 and defines a bypass duct 22 and a bypass exhaust nozzle 18. The 11ypasss airflow B flows through the bypass duct 22. The fan 23 is attached to and driven by the low pressure turbine 19 via a shaft 26 and an epicyclic gearbox 30.

In use, the core airflow A is accelerated and compressed by the low pressure compressor 14 and directed into the high pressure compressor 15 where further compression takes place. The compressed air exhausted from the high pressure compressor 15 is directed into the combustion equipment 16 where it is mixed with fuel and the mixture is combusted. The resultant hot combustion products then expand through, and thereby drive, the high pressure and low pressure turbines 17, 19 before being exhausted through the core exhaust nozzle 20 to provide some propulsive thrust. The high pressure turbine 17 drives the high pressure compressor 15 by a suitable interconnecting shaft 27. The fan 23 generally provides the majority of the propulsive thrust. The epicyclic gearbox 30 is a reduction gearbox.

Note that the terms "low pressure turbine" and "low pressure compressor" as used herein may be taken to mean the lowest pressure turbine stages and lowest pressure compressor stages (i.e., not including the fan 23) respectively and/or the turbine and compressor stages that are connected together by the interconnecting shaft 26 with the lowest rotational speed in the engine (i.e., not including the gearbox output shaft that drives the fan 23). In some literature, the "low pressure turbine" and "low pressure compressor" referred to herein may alternatively be known as the "intermediate pressure turbine" and "intermediate pressure compressor". Where such alternative nomenclature is used, the fan 23 may be referred to as a first, or lowest pressure, compression stage.

Other gas turbine engines to which the present disclosure may be applied may have alternative configurations. For example, such engines may have an alternative number of compressors and/or turbines and/or an alternative number of interconnecting shafts. By way of further example, the gas turbine engine shown in FIG. 1 has a split flow nozzle 18, 20 meaning that the flow through the bypass duct 22 has its own nozzle 18 that is separate to and radially outside the core exhaust nozzle 20. However, this is not limiting, and any aspect of the present disclosure may also apply to engines in which the flow through the bypass duct 22 and the flow through the core 11 are mixed, or combined, before (or upstream of) a single nozzle, which may be referred to as a mixed flow nozzle. One or both nozzles (whether mixed or split flow) may have a fixed or variable area. Whilst the described example relates to a turbofan engine, the disclosure may apply, for example, to any type of gas turbine engine, such as an open rotor (in which the fan stage is not surrounded by a nacelle) or turboprop engine, for example. In some arrangements, the gas turbine engine 10 may not comprise a gearbox 30.

The geometry of the gas turbine engine 10, and components thereof, is defined by a conventional axis system, comprising an axial direction (which is aligned with the rotational axis 9), a radial direction (in the bottom-to-top direction in FIG. 1), and a circumferential direction (perpendicular to the page in the FIG. 1 view). The axial, radial and circumferential directions are mutually perpendicular.

The present invention is equally applicable to aero gas turbine engines, marine gas turbine engines, and land-based gas turbine engines.

Figure 2:
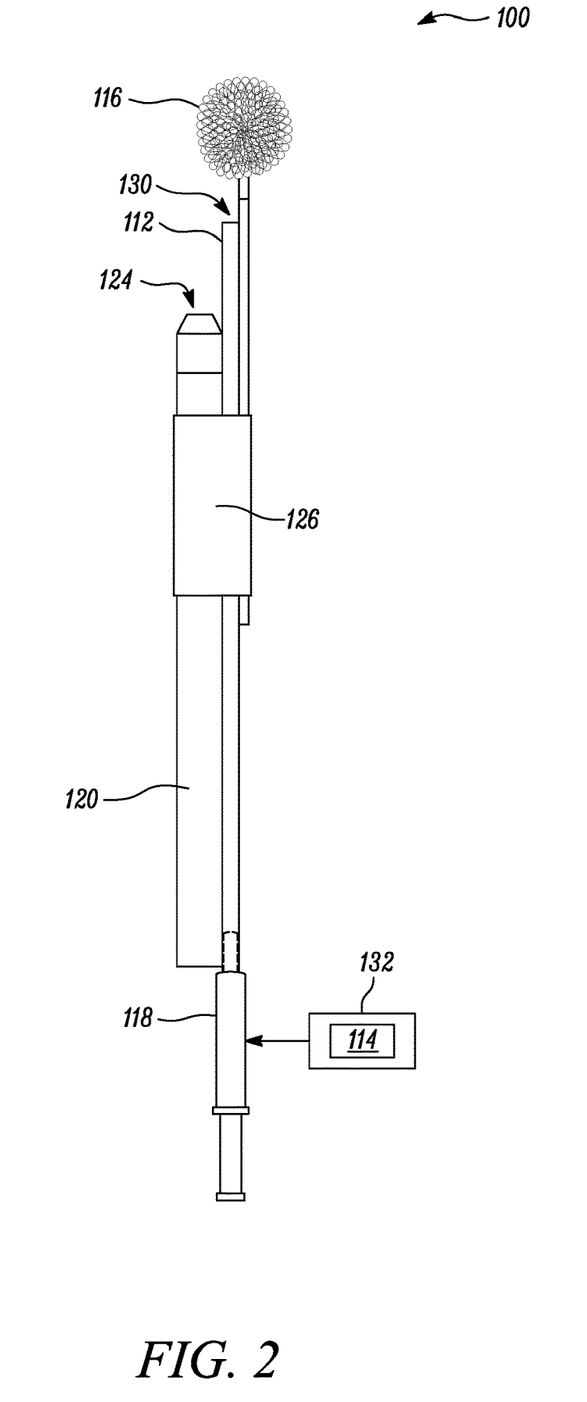
FIG. 2 is a schematic top view of a device for cleaning a component of the gas turbine engine of FIG. 1, according to an embodiment of the present disclosure.

FIG. 2 shows a schematic view of a device 100 in accordance with an embodiment of the present disclosure. The device 100 may be used for cleaning a surface 104 (shown in FIGS. 4A-4C) of a component 102 (shown in FIGS. 4A-4C). In some embodiments, the component 102 is associated with the gas turbine engine 10 (see FIG. 1). In some embodiments, the component 102 may include a shroud assembly of the gas turbine engine 10. In some embodiments, the component 102 may be a blade that may be associated with the compressor 14, 15 (see FIG. 1) or the turbine 17, 19 (see FIG. 1) of the gas turbine engine 10. However, the component 102 may include any other component/part of the gas turbine engine 10. In some embodiments, the component 102 may be made of metals, alloys, and superalloys. Further, the surface 104 may include contaminant particles 106 (shown in FIGS. 4A and 4B) as a result of an operation of the gas turbine engine 10. In some embodiments, the surface 104 of the component 102 may include one or more defects (not shown) that may have to be repaired by a repair operation. In some embodiments, the surface 104 of the component 102 may have recently undergone the repair operation to repair the defects. Further, the surface 104 of the component 102 includes the contaminant particles 106 generated as a result of the repair operation performed on the component 102. It should be noted that the contaminant particles 106 may include dust particles, debris, metallic particles of the component 102 under repair, and the like.

In some examples, the device 100 may be inserted into the gas turbine engine 10. For example, a portion of the device 100 may be receivable within a bore 108 (shown in FIGS. 4A to 4C) defined by the gas turbine engine 10. In an example, a part 110 (shown in FIGS. 4A to 4C) of the gas turbine engine 10, such as a casing or a housing, may define the bore 108. It should be noted that the bore 108 may be embodied as a port, an aperture, a hole, or any other access point in the gas turbine engine 10.

The device 100 includes a delivery tube 112. The delivery tube 112 may be made of a polymeric material, without any limitation thereto. In some embodiments, the delivery tube 112 may be transparent and flexible. In the illustrated embodiment of FIG. 2, the delivery tube 112 includes a circular cross-section. Alternatively, the delivery tube 112 may include any other cross-section, such as, square, rectangular, and the like. The delivery tube 112 is configured to inject a volume of a cleaning agent 114 onto the surface 104 of the component 102. In some examples, the delivery tube 112 may be used for dispensing the cleaning agent 114 into compact or hard to reach areas of the gas turbine engine 10. In some embodiments, the repair operation of the component 102 is performed after injecting the volume of the cleaning agent 114 onto the surface 104 of the component 102. In some other embodiments, the repair operation of the component 102 is performed before injecting the volume of the cleaning agent 114 onto the surface 104 of the component 102. The delivery tube 112 may facilitate easy injection of a desired volume of the cleaning agent 114 onto the surface 104 of the component 102.

In some embodiments, the device 100 further includes an abrasive mesh 116 attached to the delivery tube 112. The abrasive mesh 116 may be configured to contact with the surface 104 of the component 102. In some cases, the contaminant particles 106 may be stuck on the surface 104 of the component 102. Accordingly, the abrasive mesh 116 attached to the delivery tube 112 may be configured to contact with the surface 104 of the component 102 for loosening the contaminant particles 106 from the surface 104 of the component 102. In some embodiments, the abrasive mesh 116 is configured to contact with the surface 104 of the component 102 before the delivery tube 112 injects the volume of the cleaning agent 114 onto the surface 104 of the component 102. Thus, the abrasive mesh 116 may facilitate removal of any contaminant particles 106 that may be stuck to the surface 104 of the component 102. In some examples, the abrasive mesh 116 may include steel wool.

The device 100 further includes a syringe 118 fluidly coupled to the delivery tube 112. The syringe 118 may be removably coupled to the delivery tube 112. The syringe 118 is configured to dispense the cleaning agent 114 into the delivery tube 112. Further, the volume of the cleaning agent 114 dispensed into the delivery tube 112 may be controlled by the syringe 118, based on factors, such as, a size of a target area or an amount of the contaminant particles 106. The syringe 118 is further configured to aspirate the cleaning agent 114 through the delivery tube 112 in order to remove the cleaning agent 114 from the surface 104 of the component 102 after the contaminant particles 106 are absorbed by the cleaning agent 114. Thus, the single syringe 118 may be used for dispensing the cleaning agent 114 into the delivery tube 112 as well as aspirating the cleaning agent 114 from the surface 104 of the component 102 through the delivery tube 112. In some embodiments, the syringe 118 may be replaced by a nozzle that may be configured to dispense the cleaning agent 114 into the delivery tube 112 and to aspirate the cleaning agent 114 via the delivery tube 112. In other embodiments, the syringe 118 may include any other fluid dispensing/aspirating means known in the art, without any limitation thereto. In some examples, the device 100 may further include a pump (not shown) that may direct the cleaning agent 114 towards the delivery tube 112. In some other examples, the pump may further allow aspiration of the cleaning agent 114 from the surface 104.

The device 100 further includes a guide tube 120 removably attached to the delivery tube 112 and configured to guide the delivery tube 112 to a location 122 (shown in FIGS. 4A to 4C) near the surface 104 of the component 102 for injecting the volume of the cleaning agent 114 onto the surface 104 of the component 102. The guide tube 120 may allow the delivery tube 112 to be accurately positioned at the location 122 for injecting the volume of the cleaning agent 114 onto the surface 104 of the component 102. Further, the guide tube 120 may include an imaging device (not shown). The imaging device may include a camera or any other image sensor (not shown). The imaging device may be configured to generate images or videos. In some embodiments, the guide tube 120 may include a borescope. It should be further noted that the guide tube 120 may include a lens arrangement (not shown) which, in conjunction with the imaging device, may assist in visual inspection of the surface 104 before, during, or after cleaning of the surface 104. The lens arrangement may be disposed at an end 124 of the guide tube 120.

In some embodiments, the device 100 further includes a fastening means 126 to removably attach the delivery tube 112 to the guide tube 120. In other words, the guide tube 120 is removably attached to the delivery tube 112 via the fastening means 126. The fastening means 126 may securely couple the delivery tube 112 with the guide tube 120 so that the delivery tube 112 may be guided to the location 122 near the surface 104 of the component 102 for injecting the volume of the cleaning agent 114 onto the surface 104 of the component 102. In the illustrated embodiment of FIG. 2, the fastening means 126 may include an adhesive tape. However, in some examples, the fastening means 126 may include ropes, wires, cable ties, or any other fastening means, without any limitations thereto.

Figure 3:
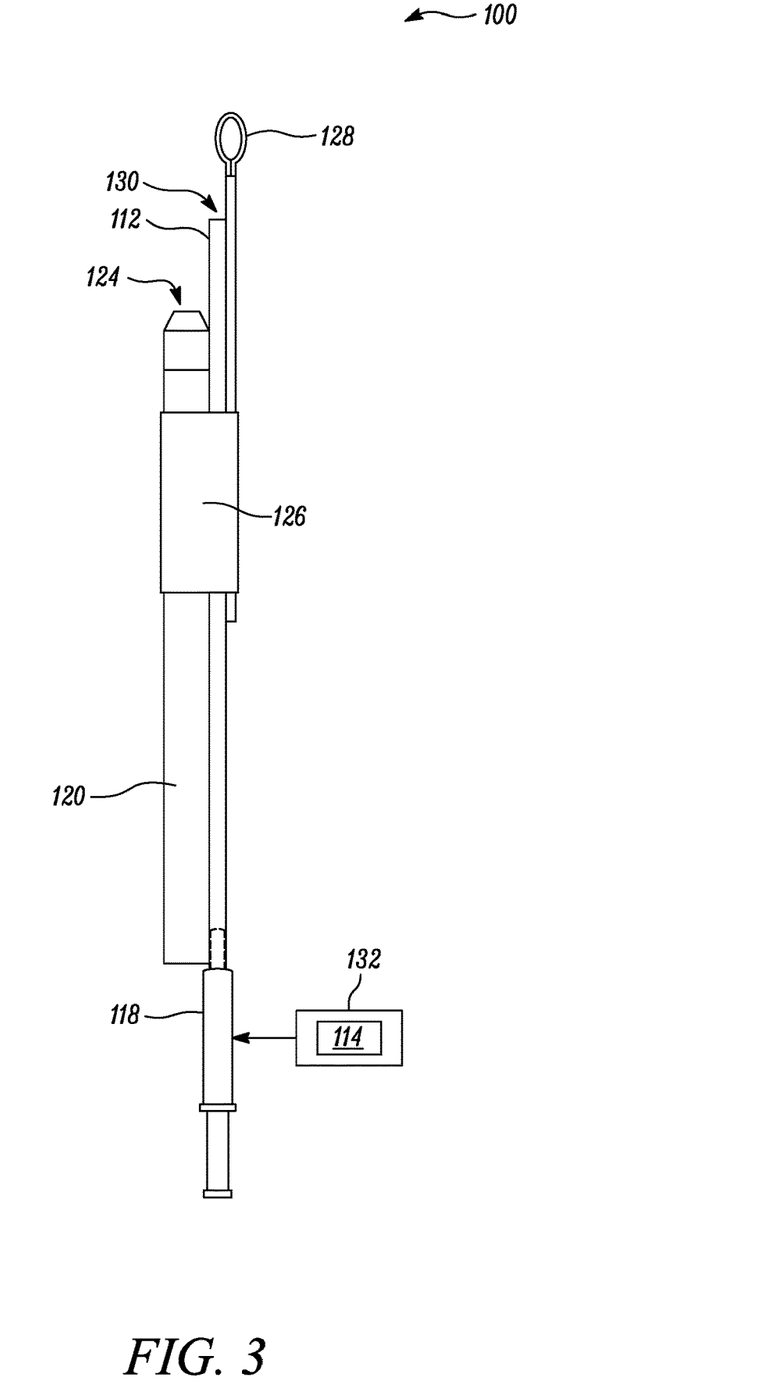
FIG. 3 is a schematic top view of the device of FIG. 2 including a loop, according to an embodiment of the present disclosure.

Referring to FIG. 3, the device 100 further includes a loop 128 connected to the delivery tube 112 and extending from an end 130 of the delivery tube 112. The loop 128 may be made of a metallic wire, for example, a steel wire. In the illustrated embodiment of FIG. 3, the metallic wire is shaped into a substantially ring shaped design to form the loop 128. Further, the loop 128 is configured to removably hold the abrasive mesh 116 (see FIG. 2). The abrasive mesh 116 may be coupled to the delivery tube 112 before the device 100 is being disposed inside the gas turbine engine 10. It should be noted that the loop 128 may be connected to the delivery tube 112 by the fastening means 126. The loop 128 may securely hold the abrasive mesh 116 while the abrasive mesh 116 contacts with the surface 104 (see FIGS. 4A to 4C) of the component 102 (see FIGS. 4A to 4C) for loosening the contaminant particles 106 (see FIGS. 4A and 4B) from the surface 104 of the component 102.

Referring to FIGS. 2 and 3, a source 132 of the cleaning agent 114 is fluidly connected to the syringe 118. The source 132 may be a storage unit for storing the cleaning agent 114. The syringe 118 may receive the cleaning agent 114 from the source 132. The cleaning agent 114 includes a mixture of at least water, borax, and polyvinyl alcohol. In some embodiments, water and borax are mixed in a weight ratio of 1:16 to obtain an activator solution. In some embodiments, polyvinyl alcohol and water are mixed in a weight ratio of 1:1 to obtain a glue solution. In some embodiments, the activator solution and the glue solution are mixed in a weight ratio of 1:1 to obtain the cleaning agent 114. The cleaning agent 114 described herein may not include any acidic substances that may corrode metallic materials of the component. Moreover, absence of any acidic substance may eliminate a requirement of a masking agent.

Further, the cleaning agent 114 may have a viscosity and adhesion characteristics that may allow the contaminant particles 106 to adhere with the cleaning agent 114. In some embodiments, the cleaning agent 114 may have a high viscosity. A composition of the cleaning agent 114 may be modified to achieve a desired viscosity and desired adhesion characteristics. Specifically, the weight ratio of the activator solution and the glue solution may be modified to achieve the desired viscosity and the desired adhesion characteristics of the cleaning agent 114. In one example, the cleaning agent 114 may include a slime. In other examples, the cleaning agent 114 may include any other solution having desired viscosity and the adhesion characteristics that may allow the cleaning agent 114 to adhere onto the contaminant particles 106 (see FIGS. 4A and 4B).

Figure 4A:
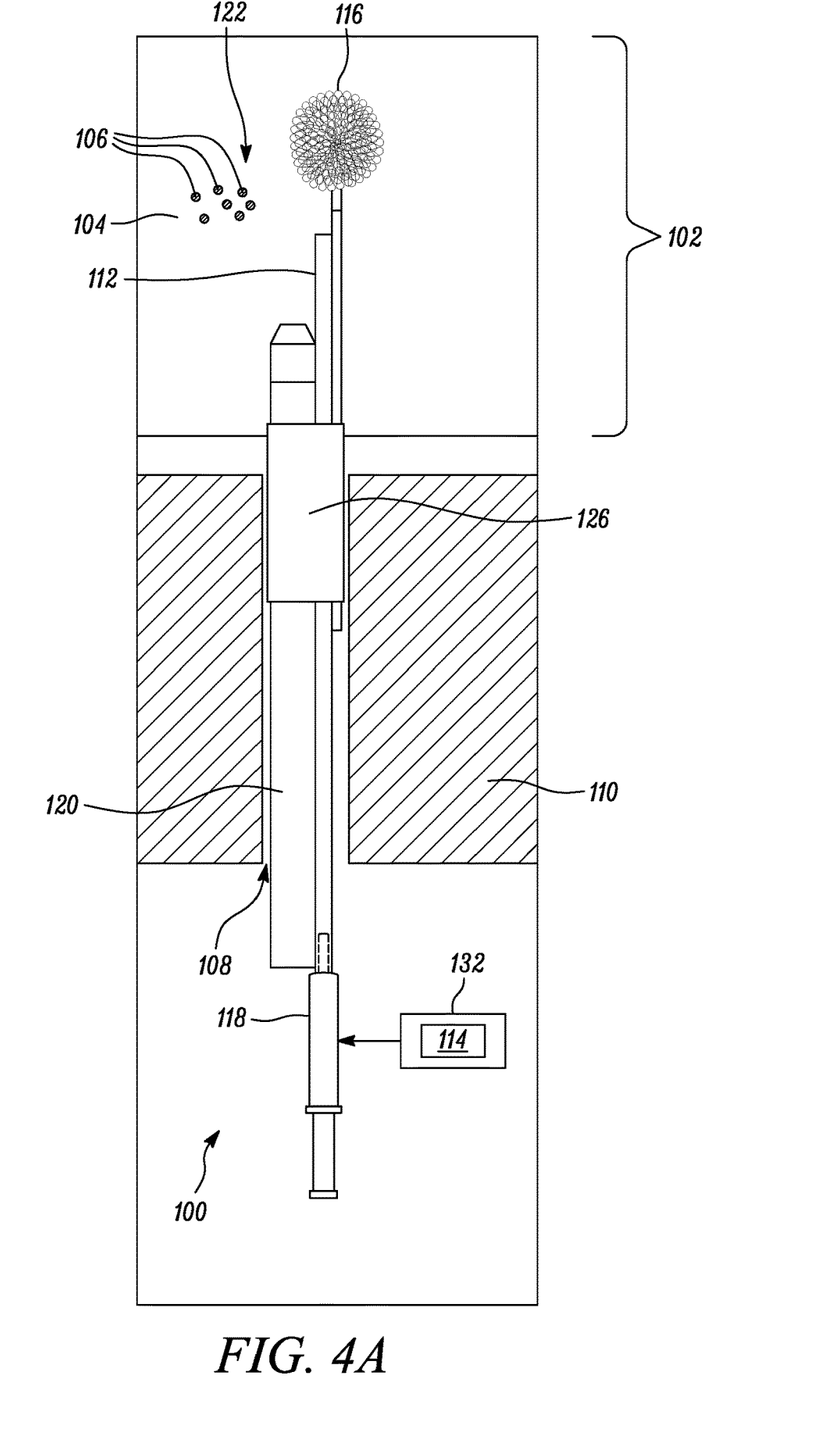
FIGS. 4A-4C are schematic views illustrating various stages of cleaning a surface of the component using the device of FIGS. 2 and 3, according to an embodiment of the present disclosure.

FIG. 4A illustrates a schematic top view of the device 100, according to an embodiment of the present disclosure. The device 100 is partially received within the gas turbine engine 10. The guide tube 120 of the device 100 guides the device 100 to the location 122 on the surface 104 of the component 102. Further, the guide tube 120 is used for visually inspecting the surface 104 of the component 102 in order to determine presence of the contaminant particles 106 on the surface 104 of the component 102.

Figure 4B:
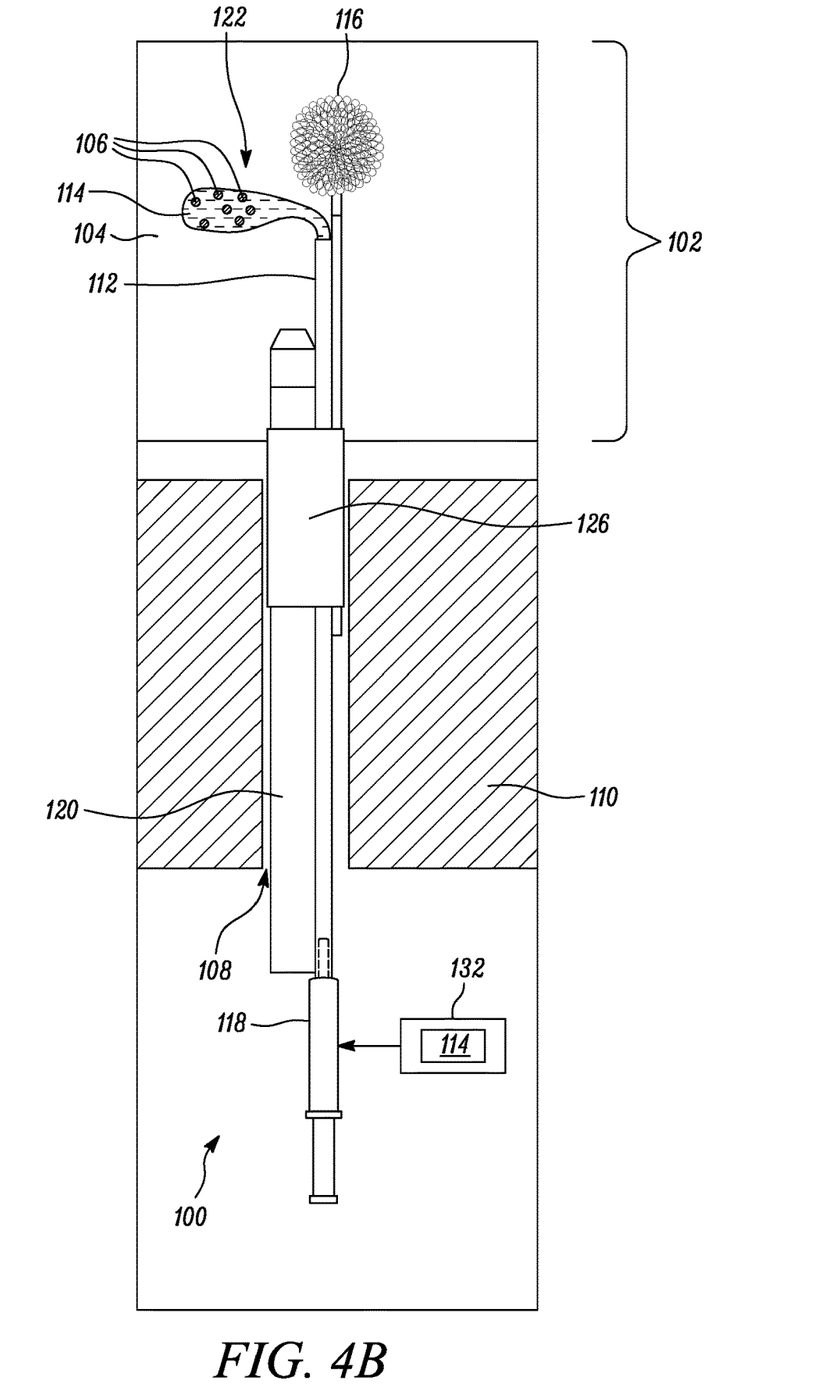

Referring to FIG. 4B, based on the determination of the contaminant particles 106, the syringe 118 dispenses the cleaning agent 114 into the delivery tube 112. Further, upon dispensing the cleaning agent 114 into the delivery tube 112, the delivery tube 112 injects the volume of the cleaning agent 114 onto the surface 104 of the component 102. FIG. 4B illustrates the cleaning agent 114 being dispensed on the surface 104 by the delivery tube 112. As illustrated, the cleaning agent 114 contacts and spreads over the surface 104 of the component 102. Moreover, upon contact of the cleaning agent 114 with the contaminant particles 106, the cleaning agent 114 absorbs the contaminant particles 106 by adhesion.

Figure 4C:
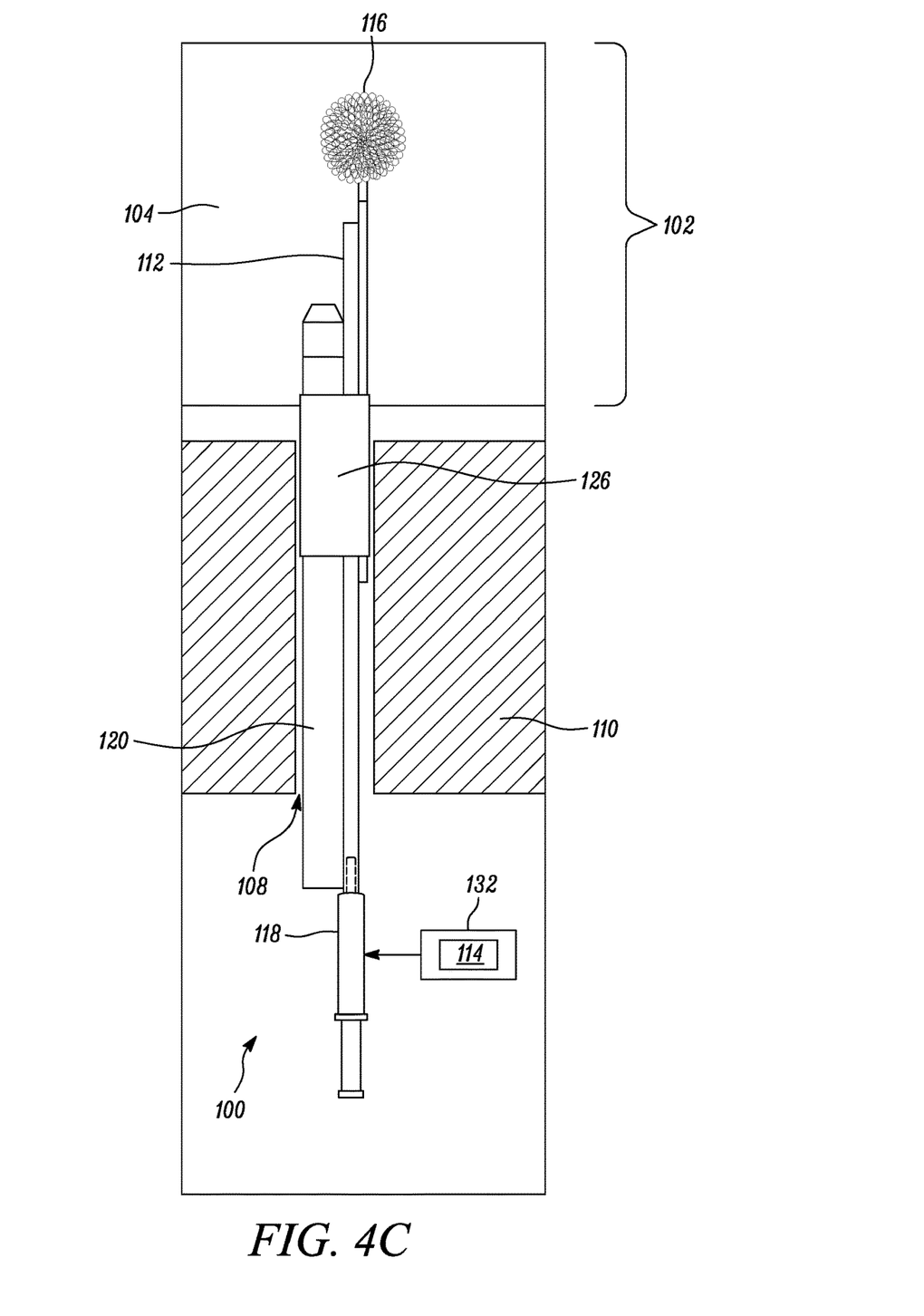

FIG. 4C illustrate the surface 104 after aspiration of the cleaning agent 114. Specifically, the syringe 118 is configured to aspirate the cleaning agent 114 through the delivery tube 112 in order to remove the cleaning agent 114 from the surface 104 after the contaminant particles 106 are absorbed by the cleaning agent 114. Thus, once the contaminant particles 106 adhere to the cleaning agent 114, the cleaning agent 114 together with the contaminant particles 106 may be aspirated from the surface 104 of the component 102, thereby presenting a clean surface.

Figure 5A:
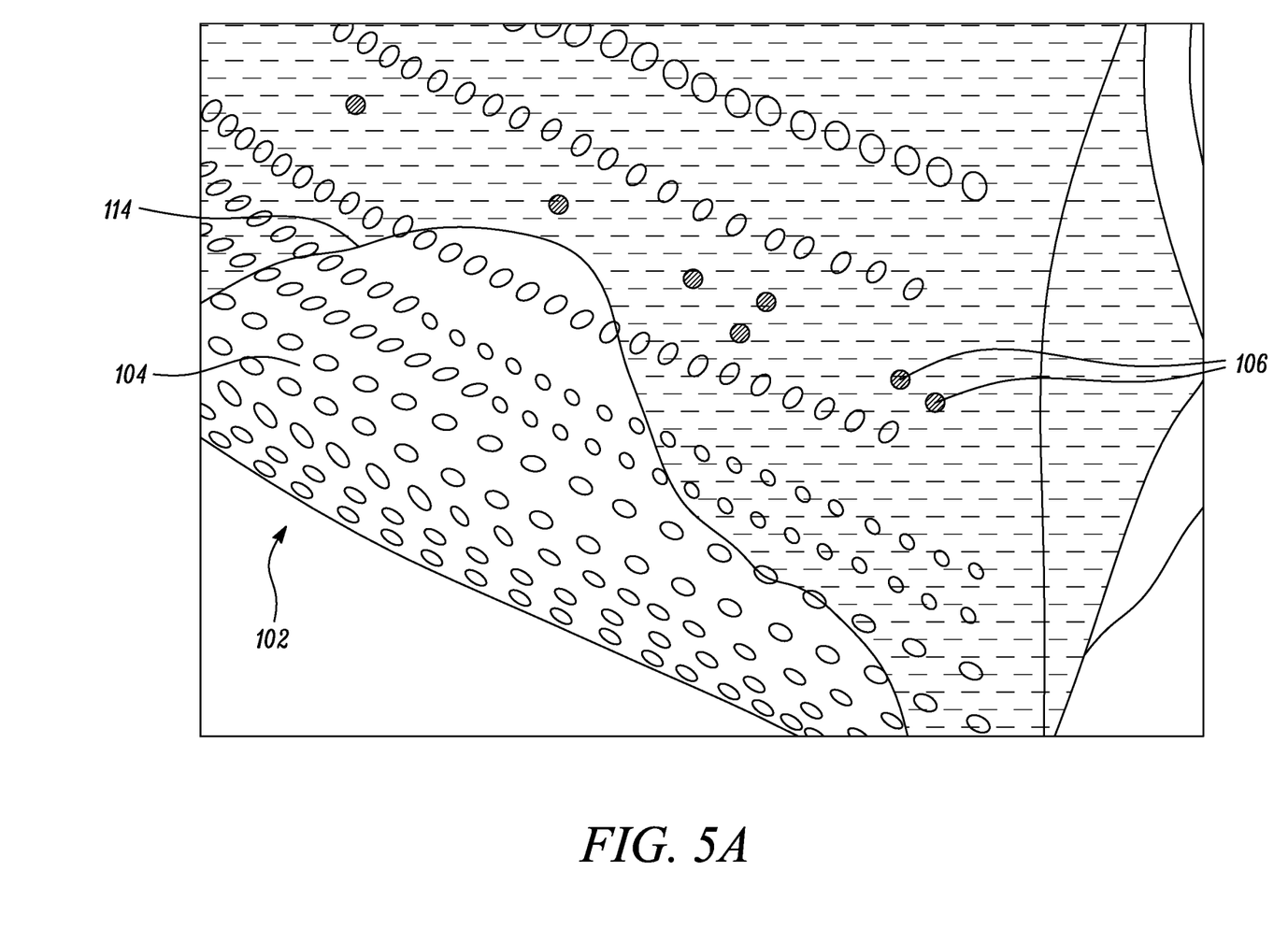
FIG. 5A is a schematic perspective view illustrating the component covered with a cleaning agent, according to an embodiment of the present disclosure.
Figure 5B:
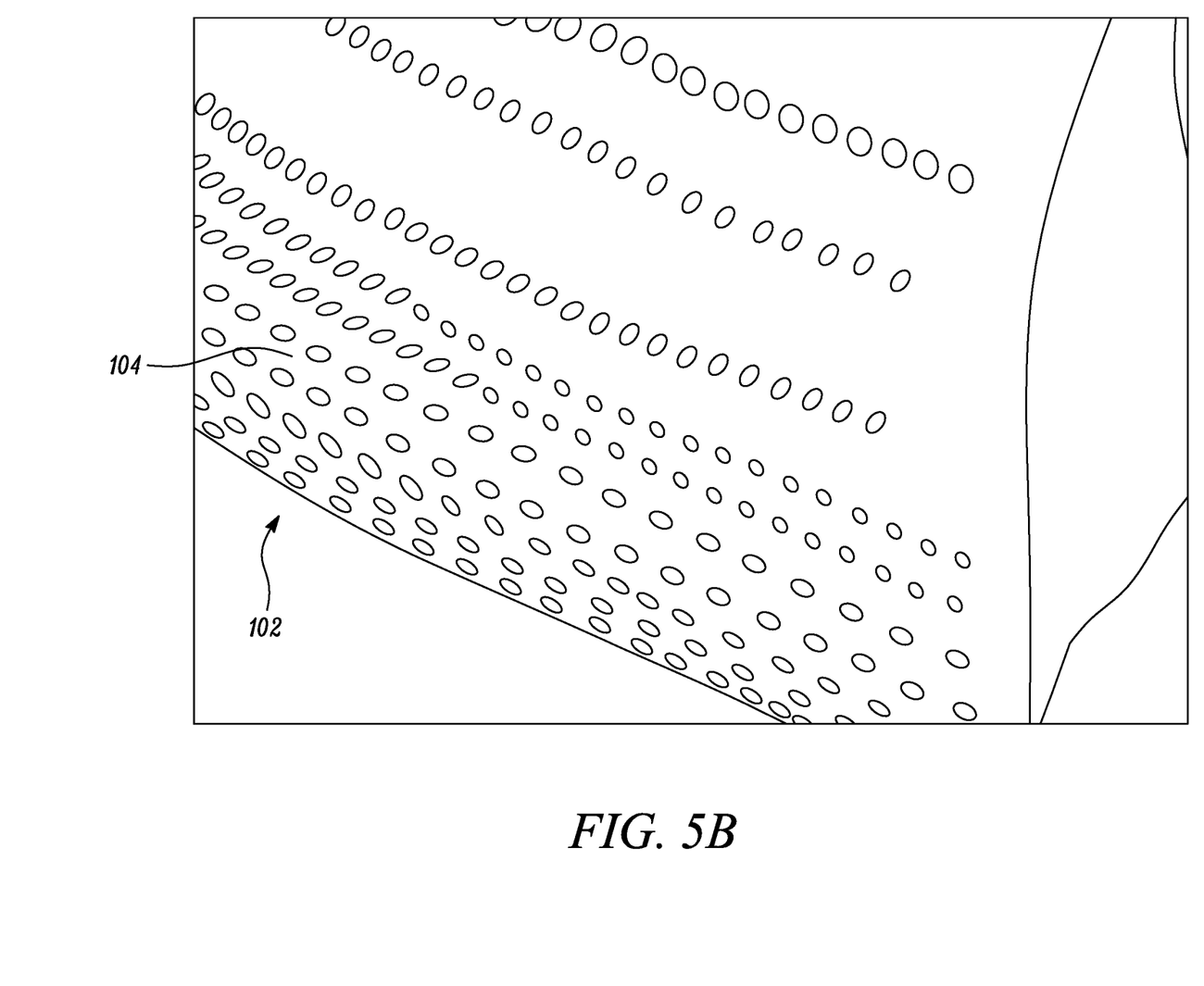
FIG. 5B is a schematic perspective view illustrating a cleaned surface of the component of FIG. 5A.

FIGS. 5A and 5B illustrate schematic perspective views of the component 102. The component 102 is embodied as a turbine blade herein. As shown in FIG. 5A, when the cleaning agent 114 is dispensed by the delivery tube 112 (see FIGS. 4A to 4C), the cleaning agent 114 may cover a portion of the surface 104 that contains the contaminant particles 106. Referring to FIGS. 5A and 5B, the contaminant particles 106 absorbed by the cleaning agent 114 may be removed from the surface 104 to provide a clean surface.

Figure 6:
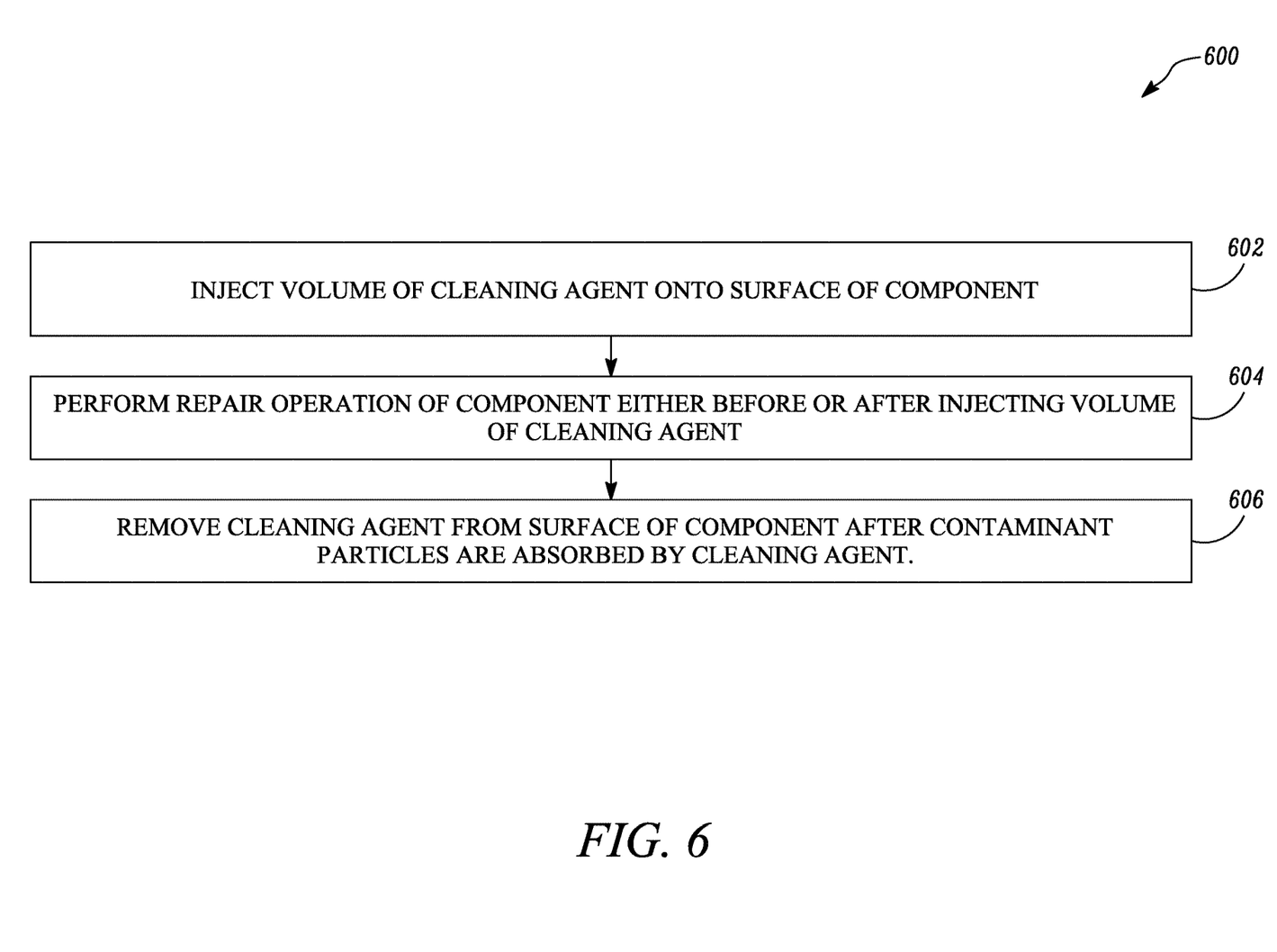
FIG. 6 is a flowchart for a method for cleaning the surface of the component, according to an embodiment of the present disclosure.

FIG. 6 illustrates a flowchart for a method 600 for cleaning the surface 104 of the component 102. In other words, the method 600 may allow cleaning of the surface 104 of the component 102 using the device 100.

At step 602, the volume of the cleaning agent 114 is placed or injected onto the surface 104 of the component 102. In some embodiments, placing the volume of the cleaning agent 114 onto the surface 104 of the component 102 further includes injecting, via the delivery tube 112, the volume of the cleaning agent 114 onto the surface 104 of the component 102. In some embodiments, the syringe 118 dispenses the cleaning agent 114 into the delivery tube 112.

In some embodiments, the delivery tube 112 is removably attached with the guide tube 120. Further, the guide tube 120 guides the delivery tube 112 to the location 122 near the surface 104 of the component 102 for injecting the volume of the cleaning agent 114 onto the surface 104 of the component 102.

In some embodiments, the abrasive mesh 116 contacts with the surface 104 of the component 102 for loosening the contaminant particles 106 from the surface 104 of the component 102 before placing or injecting the volume of the cleaning agent 114.

At step 604, the repair operation of the component 102 is performed either before or after placing or injecting the volume of the cleaning agent 114. Further, the repair operation results in the generation of the contaminant particles 106. Upon contact of the cleaning agent 114 with the contaminant particles 106, the cleaning agent 114 absorbs the contaminant particles 106 by adhesion. In some embodiments, performing the repair operation of the component 102 includes performing the repair operation after placing or injecting the volume of the cleaning agent 114. In some embodiments, performing the repair operation of the component 102 includes performing the repair operation before placing or injecting the volume of the cleaning agent 114.

At step 606, the cleaning agent 114 is removed from the surface 104 of the component 102 after the contaminant particles 106 are absorbed by the cleaning agent 114. In some embodiments, removing the cleaning agent 114 from the surface 104 of the component 102 further includes aspirating, via the syringe 118, the cleaning agent 114 from the surface 104 through the delivery tube 112 after the contaminant particles 106 are absorbed to the cleaning agent 114.

In some embodiments, the cleaning agent 114 includes the mixture of at least water, borax, and polyvinyl alcohol. In some embodiments, water and borax are mixed in the weight ratio of 1:16 to obtain the activator solution. Further, polyvinyl alcohol and water are mixed in the weight ratio of 1:1 to obtain the glue solution. Furthermore, the activator solution and the glue solution are mixed in the weight ratio of 1:1 to obtain the cleaning agent 114.

The method 600 may provide a retrofittable, robust, and an in-situ technique for cleaning of various components, which may improve an uptime of an asset, such as, the gas turbine engine 10. More particularly, the gas turbine engine 10 may not have to be disassembled to clean the component 102, thereby reducing time required for maintenance activities. The method 600 described herein may be used to clean various components of the gas turbine engine 10. Further, the method 600 described herein may allow easy and efficient removal of the contaminant particles 106, such as, dust and debris, from a number of surfaces, for example, the surface 104 of the component 102.

Using the cleaning agent 114 for cleaning the surface 104 may be more effective as compared to conventional cleaning processes. The cleaning agent 114 may easily reach constrained or compact areas of the gas turbine engine 10 and may allow removal of the contaminant particles 106 from a target area to be cleaned. Moreover, the method 600 ensures a direct contact of the cleaning agent 114 with the contaminant particles 106, which may prevent any further dispersion of the contaminant particles 106. In some cases, the cleaning agent 114 may also be reused for removal of the contaminant particles 106 from a different component.

The cleaning agent 114 may be applied prior to or after the repair of the component 102. For example, the cleaning agent 114 may be used to clean the component 102 before the repair operation, thereby presenting a clean surface for performing the repair operation. In such examples, the contaminant particles 106 may not merge with the component 102 when an operation, such as, welding or bonding, is being performed on the component 102. Further, the cleaning agent 114 may also absorb the contaminant particles 106 generated during the repair operation and can be easily removed after the repair operation. In other examples, the cleaning agent 114 may be used to clean the component 102 after the repair operation to remove any contaminant particles 106 that may be generated during the repair operation. Further, when the cleaning agent 114 absorbs the contaminant particles 106, the cleaning agent 114 and the contaminant particles 106 may be easily removed together by an extraction process.

It will be understood that the invention is not limited to the embodiments above described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. A method for cleaning a surface of a component, the method comprising:

placing a volume of a cleaning agent onto the surface of the component;

performing an operation of the component either before or after placing the volume of the cleaning agent, wherein the operation results in a generation of contaminant particles, wherein, upon contact of the cleaning agent with the contaminant particles, the cleaning agent absorbs the contaminant particles by adhesion;

removing the cleaning agent from the surface of the component after the contaminant particles are absorbed by the cleaning agent, wherein placing the volume of the cleaning agent onto the surface of the component further comprises injecting, via a delivery tube, the volume of the cleaning agent onto the surface of the component, and dispensing, via a syringe, the cleaning agent into the delivery tube, wherein removing the cleaning agent from the surface of the component further comprises aspirating, via the syringe, the cleaning agent from the surface through the delivery tube after the contaminants are absorbed to the cleaning agent.

2. The method of claim 1, further comprising:

removably attaching the delivery tube with a guide tube; and guiding, via the guide tube, the delivery tube to a location near the surface of the component for injecting the volume of the cleaning agent onto the surface of the component.

3. The method of claim 1, wherein the cleaning agent comprises a mixture of at least water, borax, and polyvinyl alcohol.

4. The method of claim 1, further comprising contacting an abrasive mesh with the surface of the component for loosening the contaminant particles from the surface of the component before placing the volume of the cleaning agent.

5. The method of claim 1, wherein performing the operation of the component comprises performing the operation after placing the volume of the cleaning agent.

6. The method of claim 1, wherein performing the operation of the component comprises performing the operation before placing the volume of the cleaning agent.

7. The method of claim 3, further comprising:

mixing water and borax in a weight ratio of 1:16 to obtain an activator solution;

mixing polyvinyl alcohol and water in a weight ratio of 1:1 to obtain a glue solution; and mixing the activator solution and the glue solution in a weight ratio of 1:1 to obtain the cleaning agent.

* * * * *